(12) United States Patent
Verhaverbeke

(10) Patent No.: US 7,235,479 B2
(45) Date of Patent: Jun. 26, 2007

(54) ORGANIC SOLVENTS HAVING OZONE DISSOLVED THEREIN FOR SEMICONDUCTOR PROCESSING UTILIZING SACRIFICIAL MATERIALS

(75) Inventor: Steven Verhaverbeke, San Francisco, CA (US)

(73) Assignee: Applied Materials, Inc., Santa Clara, CA (US)

( * ) Notice: Subject to any disclaimer, the term of this patent is extended or adjusted under 35 U.S.C. 154(b) by 199 days.

(21) Appl. No.: 10/927,572

(22) Filed: Aug. 26, 2004

(65) Prior Publication Data

US 2006/0046467 A1    Mar. 2, 2006

(51) Int. Cl.
*H01L 21/4763* (2006.01)
*G03C 5/00* (2006.01)

(52) U.S. Cl. .............. 438/637; 438/638; 438/639; 438/592; 438/151; 438/99; 257/E21.256; 257/E21.029; 430/329; 430/331

(58) Field of Classification Search .............. 438/637, 438/638; 257/E21.579, E21.029
See application file for complete search history.

(56) References Cited

U.S. PATENT DOCUMENTS

| | | | |
|---|---|---|---|
| 6,268,457 B1 | 7/2001 | Kennedy et al. | |
| 6,323,123 B1* | 11/2001 | Liu et al. | 438/638 |
| 6,372,616 B1* | 4/2002 | Yoo et al. | 438/592 |
| 6,406,995 B1* | 6/2002 | Hussein et al. | 438/638 |
| 6,440,647 B1 | 8/2002 | Yakobson | |
| 6,448,185 B1 | 9/2002 | Andideh et al. | |
| 6,696,228 B2 | 2/2004 | Muraoka et al. | |
| 6,699,330 B1* | 3/2004 | Muraoka | 134/3 |
| 2001/0021581 A1* | 9/2001 | Moon et al. | 438/637 |
| 2002/0088478 A1* | 7/2002 | Degendt et al. | 134/3 |
| 2002/0173156 A1* | 11/2002 | Yates et al. | 438/695 |
| 2002/0177301 A1* | 11/2002 | Biolsi et al. | 438/637 |
| 2003/0066549 A1* | 4/2003 | Noda et al. | 134/37 |
| 2003/0211678 A1* | 11/2003 | Chen et al. | 438/200 |
| 2004/0038518 A1* | 2/2004 | Chung | 438/631 |
| 2004/0154641 A1* | 8/2004 | Montierth | 134/3 |
| 2004/0175932 A1* | 9/2004 | Kim et al. | 438/637 |
| 2004/0202969 A1* | 10/2004 | Park et al. | 430/331 |
| 2005/0191584 A1* | 9/2005 | Shea et al. | 430/329 |
| 2006/0029879 A1* | 2/2006 | Flanigan et al. | 430/141 |

FOREIGN PATENT DOCUMENTS

EP    1 088 603 A1    9/2000
WO    WO 2004/053970 A1    12/2003

OTHER PUBLICATIONS

PCT International Search Report for PCT Application PCT/US2005/025993, Mailed Jun. 7, 2006, 10 pages.

\* cited by examiner

*Primary Examiner*—B. William Baumeister
*Assistant Examiner*—Igwe U. Anya
(74) *Attorney, Agent, or Firm*—Blakely Sokoloff Taylor & Zafman (57) ABSTRACT

A method of fabricating a semiconductor device. The method comprises creating a via in a dielectric layer that is formed on a substrate, filling the via, and optionally, the surface of the dielectric layer with a sacrificial material, patterning a first photoresist layer on the sacrificial material to define a trench for the semiconductor device, removing the first photoresist layer without affecting the sacrificial material, repatterning a second photoresist layer on the sacrificial material to define the trench for the semiconductor device, forming the trench, and removing the second photoresist layer and the sacrificial material completely after the trench is formed.

42 Claims, 8 Drawing Sheets

ORGANIC SOLVENTS HAVING OZONE DISSOLVED THEREIN FOR SEMICONDUCTOR PROCESSING UTILIZING SACRIFICIAL MATERIALS

FIELD

Embodiments of the present invention relate to semiconductor device processing methods that utilize sacrificial materials such as sacrificial light materials (SLAM), ACCU-FILL™ and DUO™ Spin-on sacrificial via fill materials (ACCUFILL and DUO are trademarks of Honeywell Electronic Materials), or bottom anti reflective coating (BARC) such as AR2 BARC offered by Shipley Co. In more particular, embodiments of the present invention relate to dual damascene processing methods that use such sacrificial light for lithography or the like processes.

BACKGROUND

Integrated circuits are made by forming on a semiconductor substrate layers of conductive material that are separated by dielectric (insulation) layers. Vias and/or trenches are etched in the dielectric layers and are filled with a conducting material to electrically connect the separated conductive layers. The vias and/or trenches filled with the conductive materials may be referred to as interconnects.

Sacrificial materials (e.g., sacrificial light materials and organic BARC material) have been used in the fabrication of semiconductor devices, for example, in making dual damascene metal interconnects. Dual damascene metal interconnects may enable reliable low cost production of integrated circuits using sub 0.25 micron process technology. Before such interconnects can realize their full potential, however, problems related to the process for making them must be addressed. One problem involves the lithography for defining dual damascene vias and trenches. Sacrificial materials, BARC materials, and photoresist materials are used throughout the lithography processes. The ability to remove these materials is crucial for the semiconductor processing. Another problem relates to the selectivity of removing certain materials, which are used to make dual damascene devices, after or throughout the processes where the vias and trenches are etched. At times, it is crucial to remove a particular layer while not affecting another layer. Another problem yet, relates to removing the sacrificial materials used during processing.

SUMMARY

Exemplary embodiments of the present invention pertain to methods of fabricating a semiconductor device that involve using a sacrificial via fill material such as DUO, SLAM, or BARC. In more particular, the embodiments provide methods where a photoresist layer can be removed for lithographic rework without removing or affecting the sacrificial materials.

In one embodiment, a method pertains to fabricating a semiconductor device includes creating a via in a dielectric layer that is formed on a substrate, filling the via, and optionally, the surface of the dielectric layer with a sacrificial material, patterning a first photoresist layer on the sacrificial material to define a trench for the semiconductor device and removing the first photoresist layer without affecting the sacrificial material. The method further may include forming and patterning a second photoresist layer on the sacrificial material to define the trench for the semiconductor device, forming the trench, and removing the second photoresist layer and the sacrificial material completely after the trench is formed. The first photoresist layer is removed, in one embodiment, due to the need for lithographic rework, such as when the first photoresist layer does not correctly or accurately define or align to a region for the trench to be formed or when the first photoresist layer has defects or wrong thickness, or otherwise deemed not optimal for subsequent processing.

In one embodiment, a method pertains to a lithographic rework process in which the method includes contacting a substrate having formed thereon a sacrificial layer and a first photoresist layer with an acetic acid solution having ozone dissolved therein, the photoresist layer being patterned on the sacrificial layer, and wherein the photoresist layer is contacted with the acetic acid solution having ozone dissolved therein which causes the photoresist layer to be removed without affecting the sacrificial layer. The photoresist layer being removed due to inaccurately or otherwise not correctly formed or patterned or when the photoresist layer has defects or wrong thickness, or otherwise deemed not optimal for subsequent processing.

In one embodiment, a method pertains to fabricating a semiconductor device, which includes transferring a substrate from an input/output module to a wet cleaning module. The substrate having formed thereon a sacrificial layer and a first photoresist layer patterned on the sacrificial layer. The method further includes contacting an organic acid solvent having ozone dissolved therein to the side of the substrate with the first photoresist layer to remove the first photoresist layer without affecting the sacrificial layer and removing the substrate from the wet cleaning module. The method further includes forming and patterning a second photoresist layer on the sacrificial layer after the first photoresist layer is removed and forming a trench. The substrate may include a dielectric layer and a via formed in the dielectric layer with the via has at least a portion of the sacrificial layer deposited therein and wherein the trench is formed in the dielectric layer. The sacrificial layer and the second photoresist layer are removed after the trench is formed. The first photoresist layer is removed, in one embodiment, due to the need for lithographic rework, such as when the first photoresist layer does not correctly or accurately define or align to a region for the trench to be formed or when the first photoresist layer has defects or wrong thickness, or otherwise deemed not optimal for subsequent processing.

Several embodiments are also described herein which pertain to some exemplary systems that can be used to practice one or more aspects of the invention.

BRIEF DESCRIPTION OF THE DRAWINGS

The invention will be understood more fully from the detailed description given below and from the accompanying drawings of various embodiments of the invention, which, however, should not be taken to limit the invention to the specific embodiments, but are for explanation and understanding only. In the drawings.

DETAILED DESCRIPTION

In the following description, for purposes of explanation, numerous specific details are set forth. It will be evident, however, to one skilled in the art that the embodiments of present invention may be practiced without these specific details. In other instances, specific apparatus structures and methods have not been described so as not to obscure the present invention.

Embodiments of the present invention relate to semiconductor device processing methods that utilize sacrificial via fill materials such as sacrificial light material (SLAM) or ACCUFILL™ and DUO™ Spin-on sacrificial via fill materials (ACCUFILL and DUO are trademarks of Honeywell Electronic Materials) or organic BARC materials such as AR2 BARC offered by Shipley. The sacrificial via fill material (or sacrificial material) generally includes oxide structures and organic components, typically is light reflective, and does not remain in the device after the fabrication is complete. In more particular, embodiments of the present invention relate to dual damascene processing methods that use such sacrificial materials where if there is need for lithographic reworks, a photoresist layer can be removed without affecting or needing to remove the sacrificial material typically formed below the photoresist layer.

In making semiconductor devices, sacrificial materials and photoresist materials have been used, for example, in fabricating dual damascene metal interconnects. These materials have been used in making or defining dual damascene vias and trenches in conjunction with lithography processes for the semiconductor devices. The ability to remove these materials is crucial for the semiconductor processing. Also, there are times, the photoresist material needs to be removed, for example, for lithographic rework, without affecting the sacrificial material so that there is no need to unnecessarily remove the sacrificial material and redeposit the sacrificial material. Lithographic rework is needed when the photoresist layer that is formed on a substrate for defining a trench or via area is not accurately or correctly patterned, aligned, or defined. Lithographic rework may also be needed when the photoresist layer is formed with defects, wrong thickness or dimension, or otherwise deemed not optimal for subsequent processing. In such event, the photoresist layer needs to be removed and a new photoresist layer needs to be deposited and defined (deposit a new layer of photoresist, expose and develop the new layer of photoresist). However, there is no need to remove the sacrificial material for lithographic rework. Indeed, having to remove the sacrificial material adds cost and time to the semiconductor device fabrication process. In a typical semiconductor fabrication processing, about one out of twenty times, lithographic rework is required. Under the current technology, when there is need for lithographic rework, the photoresist is not selectively removed without affecting the sacrificial material. It will be apparent from this disclosure that exemplary embodiments of the present invention allows for the photoresist to be removed selectively without affecting or removing the sacrificial material or other similar material during a semiconductor fabrication process, for instance, where lithographic rework is necessary. In one embodiment, the photoresist material that needs to be selectively removed without affecting the sacrificial material or other similar material is removed in a wet cleaning module (e.g., a single-wafer wet cleaning chamber) using an organic acid solvent having ozone dissolved therein such as acetic acid having ozone dissolved therein, propionic acid having ozone dissolved therein, and butyric acid having ozone dissolved therein. An exemplary embodiment of such a module is also described herein (below).

FIGS. 1-9 illustrate structures that may results from exemplary embodiments of the present invention. The embodiments are presented in the context of making a device that includes a dual damascene interconnect. These embodiments can be used for other similar structures where a photoresist needs to be removed for lithographic rework without affecting a layer having similar characteristic as the sacrificial material.

Figure 1:
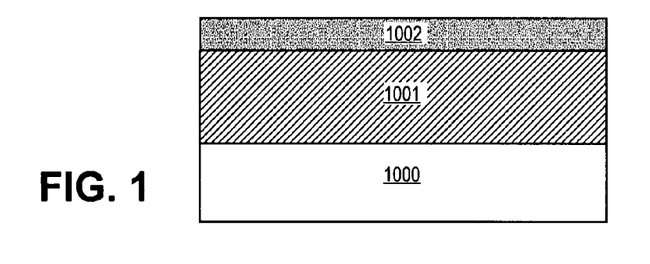
FIGS. 1-9 illustrate a cross-section of exemplary structures that may result after certain processes used to make a semiconductor device in accordance to embodiments of the present invention.

In FIG. 1, a first conductive layer 1101 is formed on a substrate 1000. The substrate 1000 may be any surface generated when making a semiconductor device or an integrated circuit, upon which a conductive layer may be formed. The first conductive layer 1101 is typically formed to allow electrical interconnect to the device or the integrated circuit formed in the substrate 1000. In one embodiment, the substrate 100 includes active and/or passive devices that are formed on a silicon wafer such as transistors, capacitors, resistors, diffused junctions, gate electrodes, local interconnects, etc. . . . Additionally, the substrate 1000 may include semiconductor layers that active or passive devices are formed thereon or therein. The substrate 1000 also may include insulating materials (e.g., silicon dioxide, either undoped or doped with phosphorus (PSG) or boron and phosphorus (BPSG); silicon nitride; silicon oxynitride; or a polymer) (not shown) that separate such active and passive devices from the conductive layer or layers that are formed on top of them, and may include previously formed conductive layers. The substrate 1000 is typically made of a semiconductor material (e.g., silicon monocrystalline silicon, silicon-on-insulator, silicon-germanium or other suitable materials used in the field).

The conductive layer 1001 may be made from materials conventionally used to form conductive layers for integrated circuits such as copper, copper alloy, tungsten, aluminum or an aluminum alloy, and aluminum/copper alloy. Alternatively, the conductive layer 1001 may be made from doped polysilicon or a silicide, e.g., a silicide comprising tungsten, titanium, nickel or cobalt. In one embodiment, the conductive layer 1001 includes a number of separate layers. The conductive layer 1001 may comprise a primary conductor made from an aluminum/copper alloy that is sandwiched between a relatively thin titanium layer located below it and a titanium, titanium nitride double layer located above it. The conductive layer 1001 may also comprise a copper layer formed on underlying barrier and seed layers. The conductive layer 1001 may also be a composite film stack.

In one embodiment, the conductive layer 1001 is formed by a chemical vapor. In another embodiment, the conductive layer 1001 is formed by a physical deposition process. In an embodiment where copper is used to make the conductive layer 1001, a conventional copper electroplating process may be used. Techniques for forming a conductive layer such as the conductive layer 1001 are well known to those of ordinary skilled in the art.

Figure 2:
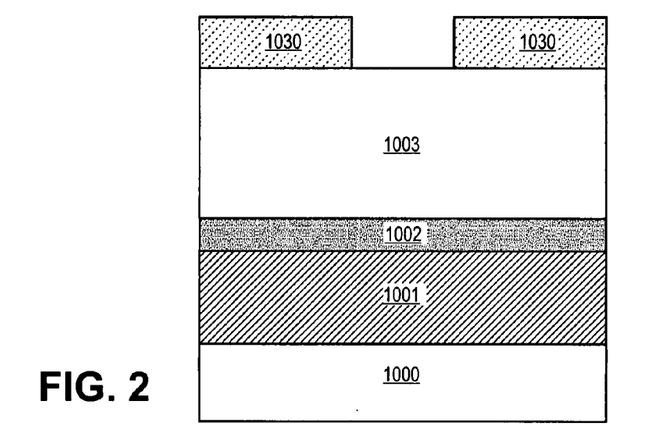

Also in FIG. 1, a barrier layer 1002 is formed on the conductive layer 1001. In one embodiment, the barrier layer 1002 serves to prevent an unacceptable amount of copper, or other conductive metals, from diffusing into a dielectric layer 103 (FIG. 2). The barrier layer 1002 also acts as an etch stop to prevent subsequent via and trench etch processing from exposing the conductive layer 1001 to subsequent cleaning processes. In one embodiment, the barrier layer 1002 is made from silicon nitride and in other embodiments, made from materials that can serve the functions previously mentioned. Other examples for the barrier layer 1002 include titanium nitride, silicon carbide, or silicon oxynitride.

In one embodiment, the barrier layer 1002 is formed from silicon nitride and can be formed using a chemical vapor deposition process. The barrier layer 1002 should be thick enough to perform its diffusion inhibition and etch stop functions, but not so thick that it adversely impacts the overall dielectric characteristics resulting from the combination of the barrier layer 1002 and the dielectric layer 1003. In one embodiment, the thickness of the barrier layer 1002 is less than about 10% of the thickness of the dielectric layer 103.

In one embodiment, the conductive layer 1001 and barrier layer 1002 are planarized after they are deposited. In one embodiment, the conductive layer 1001 and barrier layer 1002 are planarized using a chemical mechanical polishing (CMP).

FIG. 2 illustrates that the dielectric layer 1003 is formed on top of the barrier layer 1002. In one embodiment, the dielectric layer 1003 comprises silicon dioxide, which is deposited on the surface of the barrier layer 1002 using a conventional method such as plasma enhanced chemical vapor deposition (PECVD) process. An exemplary silicon source that can be used with the PECVD process includes tetraethylorthosilicate (TEOS) as the silicon source. In other embodiments, the dielectric layer 1003 is made from other materials that can insulate one conductive layer from another. An example of a material that can be used to make the dielectric layer 1003 include an organic polymer selected from the group that includes polyimides, parylenes, polyarylethers, polynaphthalenes, and polyquinolines, or copolymers thereof. Examples of other organic dielectric materials include SiO-based dielectric, SiOCH, SiOF, and Spin-on-SiOCH. The dielectric layer 1003 can also be made of a commercially available polymer sold by Dow Chemicals under the trade name SiLK™ or those sold by Honeywell International, Inc., under trade names FLARE™, GX3 and GX3P. The dielectric layer 1003 can also be made of an inorganic dielectric material such as fluorinated silica glass (FSG) and phosphorous doped TEOS (pTEOS). In some embodiment, the dielectric layer 1003 comprises fluorinated silicon dioxide or a porous silicon dioxide, e.g., silicon dioxide doped with carbon. Methods of making or forming the dielectric layer 1003 are known to those skilled in the art. In one embodiment, the dielectric layer 1003 is formed to have a thickness of between about 2,000 and about 20,000 angstroms.

Also in FIG. 2, after the dielectric layer 1003 is formed, a photoresist layer 1030 is deposited and patterned or defined on top of the dielectric layer 1003 to define a via formation region for receiving a subsequently formed conductive layer that will contact the first conductive layer 1001. The photoresist layer 1030 can be a positively developed photoresist layer or a negatively developed photoresist layer as is known in the art. In one embodiment, the photoresist layer 1030 may be patterned or defined using conventional photolithographic techniques, such as masking the layer of photoresist material, exposing the masked photoresist layer to light, then developing the unexposed portions. The photoresist layer 1030 may be removed and redeposited for lithographic rework if necessary. In one embodiment, the photoresist layer 1030 is selectively removed using an organic acid solvent having ozone dissolved therein using a wet cleaning module.

Figure 3:
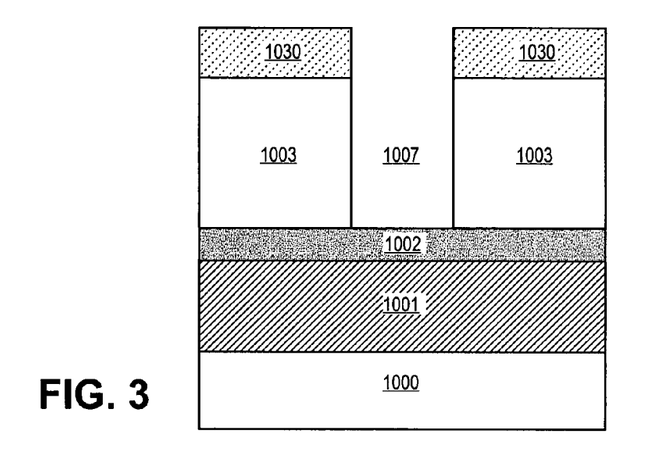

FIG. 3 illustrates that a via 1007 is formed in the dielectric layer 1003. In one embodiment, after the photoresist 1030 is patterned, the via 1007 is etched through the dielectric layer 1003 down to the barrier layer 1002. Conventional methods can be used to etch the dielectric layer 1003 to form the via 1007. An example of such a method includes an anisotropic dry oxide etch process. In an embodiment when silicon dioxide is used to form the dielectric layer 1003, the via is etched using a medium density magnetically enhanced reactive ion etching system ("MERIE system") using fluorocarbon chemistry, which is known in the art.

Figure 4:
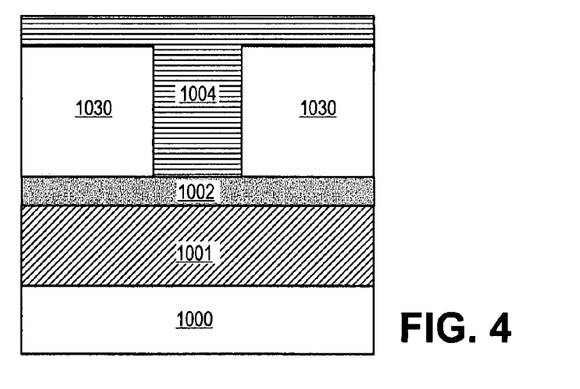

In FIG. 4, a sacrificial material is used to fill the via 1007. In one embodiment, after the via 1007 is formed through the dielectric layer 1003, the via 1007 is filled with a sacrificial material 1004. In one embodiment, the sacrificial material 1004 has dry etch properties similar to those of the dielectric layer 1003. The sacrificial material 1004 may comprise a spin-on-polymer (SOP) or spin-on-glass (SOG), a sacrificial light absorbing material (SLAM), or a similar SLAM material with a trade name DUO (made by Honeywell Electronic Materials). DUO is an organosiloxane polymer designed to absorb at 248 nm radiation. DUO is also a hybrid of oxide (SiO) structures and organic components (e.g., benzene ring, $CH_3$ and $CH_2$). The sacrificial material 1004 may also be made of a bottom anti-reflective coating material such as AR2 BARC (made by Shipley Co.). In one embodiment, the sacrificial material 1004 is deposited by spin coating to a thickness of about 500 and about 3,000 angstroms of the material onto the surface of the device, using conventional process steps. Although only a thin layer remains on the surface of the device, such a spin coating process causes the sacrificial material 1004 to substantially, or completely, fill the via 1007. The sacrificial material is typically a material that can uniformly fill the via 1007 for a lithographic process and will not remain with the device after the fabrication of the device is completed. The sacrificial material thus needs to be a material that can be selectively removed.

Figure 5A:
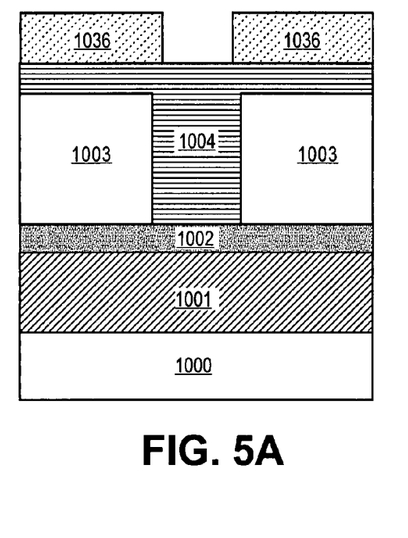
Figure 5B:
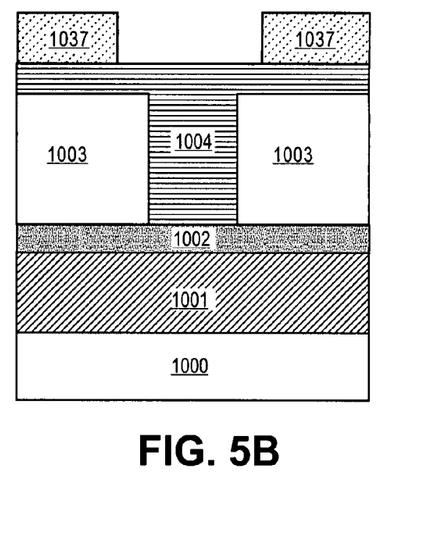

In FIG. 5A, after the via 1007 is filled with the sacrificial material 1004, a photoresist layer 1036 is applied on top of the sacrificial material layer 1004, then patterned to define a trench formation region. The photoresist layer 1036 may be patterned using conventional photolithographic techniques. The pattern of the photoresist layer 1036 may need to be inspected for accuracy of critical dimension and alignment. Conventional methods can be used for such inspection. The pattern of the photoresist layer 1036 can be inspected for accuracy using conventional optional inspection technique, for instance, a rigorous coupled wave analysis or other imaging techniques as is known in the art. Often or sometimes, (e.g., one out of twenty times) lithographic rework is needed for the photoresist layer 1036, for instance, when the pattern is not defined or aligned correctly or accurately. In other instances, the photoresist layer 1036 may needs to be removed due to other reasons such as defects, wrong thickness, or dimension, or otherwise being deemed not optimal for subsequent processing. The photoresist layer 1036 thus needs to be removed completely and redeposited. In redeposit, a new photoresist layer needs to be deposited, masked, exposed, and developed. For instance, FIG. 5A illustrates the photoresist layer 1036 which may be misaligned or otherwise not patterned correctly. The photoresist layer 1036 is removed and a new photoresist layer 1037 is formed and patterned as shown in FIG. 5B.

Under the current technology, when the photoresist layer 1036 needs to be removed for lithographic rework, the removal process also unnecessarily removes the sacrificial layer 1004. Such a process increases cost and time of making the devices. It is thus desirable to have a process that will remove only the photoresist layer 1036 selectively and/or without affecting the sacrificial material 1004 to eliminate the need to redeposit the sacrificial material 1004 into the via 1004 and over the dielectric layer 1003. In one embodiment, for lithographic rework, the photoresist layer 1036 is removed using an organic acid solvent having ozone dissolved therein. Such an organic acid solvent is a solvent that can dissolve the ozone. Examples of the solutions that can be used to selectively remove the photoresist layer 10036 include acetic acid having ozone dissolved therein, propionic acid having ozone dissolved therein, and butyric acid having ozone dissolved therein. In one embodiment, the organic acid solvent having ozone dissolved therein is an acetic acid solution having ozone dissolved at about 100 ppm or higher concentration. In another embodiment, the organic acid solvent having ozone dissolved therein is an acetic acid solution having ozone dissolved at about 200 ppm-500 ppm concentration. In another embodiment, the acetic acid solution has a concentration of about 99% v/v. In another embodiment, the acetic acid solution has a concentration of about 99% v/v and the dissolved ozone in the acetic acid solution is greater than about 100 ppm or about 200-500 ppm.

In one embodiment, to selectively remove the photoresist layer 1036, the organic acid solvent having ozone dissolved therein is allowed to contact the substrate 1001, more particularly, allowed to contact the photoresist layer 1036, for a predetermined period of time (e.g., 20 seconds to 2-3 minutes) sufficient to remove the photoresist layer 1036. The organic acid solvent having ozone dissolved therein can contact the photoresist layer 1036 in a number of ways including (i) immersing the substrate 1000 in a bath that contains the organic acid solvent having ozone dissolved therein followed by an immediate rinse in pure water; (ii) spinning the substrate 1000 in a single wafer cleaning chamber with or while the organic acid solvent having ozone dissolved therein is dispersed over the substrate 1000, (iii) splashing the organic acid solvent having ozone dissolved therein over the substrate 1000 or (iv) rinsing the substrate 1000 with the organic acid solvent having ozone dissolved therein.

In one embodiment, the organic acid solvent having ozone dissolved therein removes the photoresist layer 1036 at a rate of about 5 μm/minute under room temperature condition. In one embodiment, organic acid solvent having ozone dissolved therein includes a small amount (e.g., about 1-5% v/v) of hydrogen fluoride (HF). Having HF in the solvent will helps removing metallic contaminants that may be present (e.g., as in an embodiment where the substrate is spun which may generate some weak metallic effects on the substrate). Additionally, the organic acid solvent having ozone dissolved therein can be recycled and refined (e.g., by distillation) for repeat usages when necessary.

After the photoresist layer 1036 is removed, the resulting structure is similar to the structure shown in FIG. 4. After the photoresist layer 1036 is removed due to the need for lithographic rework, for example, the new photoresist layer 1037 can be deposited, exposed, and developed to define a region for the trench of the device. The resulting structure with the new photoresist layer 1037 is the structure shown in FIG. 5B. FIG. 5B also illustrates that the photoresist layer 1037 is aligned more accurately or correctly to define a region of the trench 1006. Alternatively, the photoresist layer 1037 may have a more accurate thickness or dimension than the photoresist layer 1036.

It is to be noted that the embodiments for selectively removing the photoresist layer 1036 without affecting or removing the sacrificial material 1004 can similarly be used to remove the photoresist layer 1036 as previously mentioned.

Figure 6:
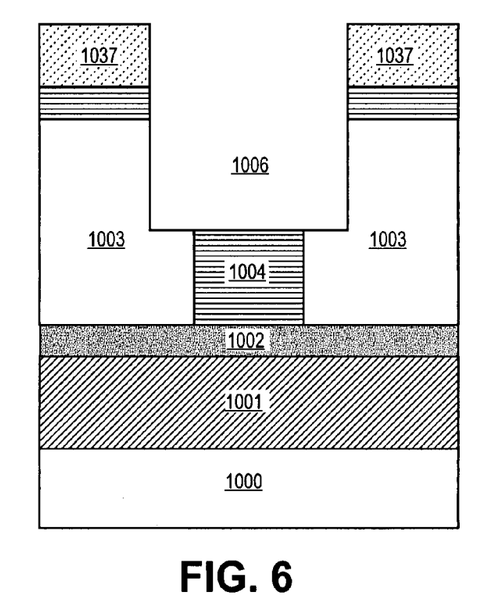

In FIG. 6, a trench 1006 is formed following the photoresist patterning and any necessary lithographic inspection and/or rework. As shown in FIG. 6, the trench 1006 is etched into the dielectric layer 1003. The etching process is applied for a time sufficient to form the trench 1006 with a desired depth. In one embodiment, the etch chemistry chosen to etch the trench 1006 removes the sacrificial material 1004 at a slightly faster rate than it removes the dielectric layer 1003, to avoid formation of defects. The trench 1006 may be etched using the same equipment and etch chemistry that had been used previously to etch the via 1007. As with the via etch step, the barrier layer 1002 may act as an etch stop during the trench etching process, protecting the underlying conductive layer 1001 from the etch step and any subsequent ashing or cleaning steps. In addition, the presence of any portion of the sacrificial material 1004 that remains at the bottom of the via 1007 after the trench etch step may help ensure that the conductive layer 1001 will not be affected by the trench etch process.

Because forming the trench 1006 requires etching into the sacrificial material 1004 as well as the dielectric 1003, it is desirable that the sacrificial material and the dielectric material have similar etching properties with the sacrificial material preferably has slightly faster etch rate than the dielectric material. Additionally, by filling the via 1007 with the sacrificial material 1004 that has dry etch characteristics like those of the dielectric layer 1003, the trench lithography process may effectively have a substantially "hole-free" surface, similar to one without the vias 1007. In one embodiment, the sacrificial material 1004 is selected so that it has an etch chemistry similar to the dielectric layer 1003 so that the trench 1006 may be etched into the dielectric layer 1003 at a rate that is almost as fast as the sacrificial material 1004 is removed. Such a process protects the underlying barrier layer 1002 during the trench 1006 etching. Such a process also permits the use of a trench etch chemistry that produces superior trench and via profiles without having to consider the effect such etch chemistry might have on the selectivity between the dielectric layer 1003 and the barrier layer 1002.

In an embodiment, the dielectric layer 1003 comprises silicon dioxide and the barrier layer 1002 comprises silicon nitride, an etch chemistry to be used to etch the trench 1006 should be one that does not provide a high selectivity to silicon dioxide and to silicon nitride. In addition, because the process of the present invention reduces the amount of time during which the barrier layer 1002 is etched during the trench etch process, the thickness of barrier layer 1002, e.g., a silicon nitride layer, when initially deposited, is only minimally reduced (e.g., only less than about 400-600 angstroms is etched).

Figure 7:
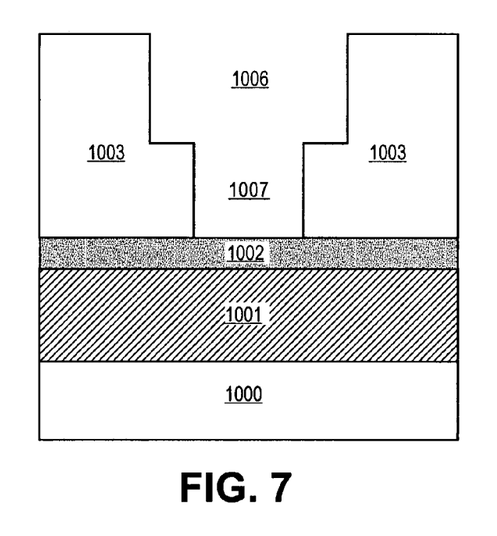
Figure 8:
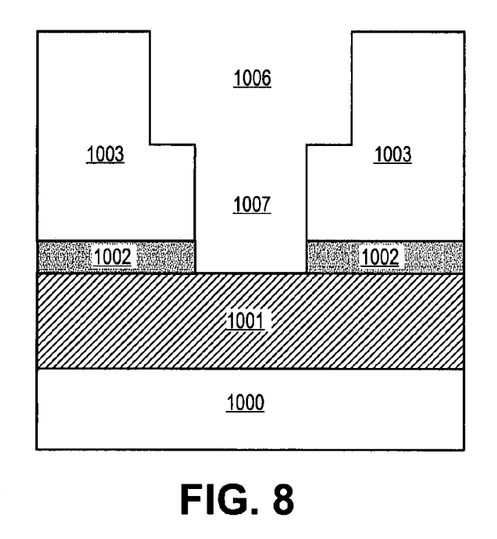

After the trench 1006 is etched, the photoresist layer 1037 and the sacrificial material 1004 and residues that may remain on the device's surface and inside the vias 1007 are removed or cleaned (FIG. 7). In one embodiment, the photoresist 1037 is removed using a conventional ashing process using a dry stripping module (an exemplary embodiment of such a module is described herein and below). The photoresist layer 1037 can also be removed using a conventional high temperature $O_2$ plasma ashing process. In another embodiment, the photoresist 1037 is removed using an organic acid solvent having ozone dissolved therein (e.g., acetic acid solution with ozone dissolved therein) in a wet cleaning module (an exemplary embodiment of such a module is described herein and below).

When conventional ashing is used, the sacrificial material 1004 may be removed simultaneously in the same process with the photoresist layer 1036. Additionally, when an ashing process is used, to ensure removal of remaining portions of the sacrificial material 1004, a wet etch process that has a significantly higher selectivity for sacrificial material 1004 over the dielectric layer 1003 can be used. In an embodiment where the sacrificial material 1004 comprise DUO, the DUO sacrificial material 1004 can also be removed using (i) a fluoride-based chemistry or (ii) an alkaline-based chemistry. Examples of commercially available alkaline-based chemistries that can be used to remove the sacrificial material 1004 that includes DUO include JT Baker Clk™-888 (a trademarked product of J. T. Baker), EZStrip™ solvents (trademarked products of Ashland's Electronic Chemicals), EKC 5610™-DP/EKC 5625™-DP (trademarked products of EKC Technology, Inc.) and TMAH-based solvent. Examples of commercially available fluoride-based chemistries that can be used to remove the sacrificial material 1004 that includes DUO include ATMI's AP-800M, ATMI's AP-806, ATMI's AP-810, ATMI's AP-811, EZStrip solvents, DAIKIN's DAAF and DAIF series, and ACT® NE-89 (a registered trademarked product of Ashland's Electronic Chemicals). These chemistries are typically used to remove the sacrificial material when the material for the dielectric layer 1003 comprises an organic material or comprises of a low-k dielectric material (e.g., SiO2, Si—O based dielectric such as SiOCH, SiOF, and Spin-on SiOCH). Another exemplary chemistry that can be used to remove the sacrificial material includes a buffered oxide etch containing high concentration of HF (BOE) with a concentration of about 500:1. BOE is particularly useful to selectively remove the sacrificial material 1004 when the dielectric layer 1003 is an inorganic dielectric material.

In an alternative embodiment, the photoresist layer 1037 and the sacrificial material 1004 are not removed simultaneously and can be removed sequentially. In one embodiment, the photoresist layer 1037 is removed using an organic acid solvent having ozone dissolved therein and the sacrificial material 1004 is removed by a method appropriate for the particular sacrificial material used. For example, if the sacrificial material 1004 is a DUO like material, the sacrificial material 1004 can be removed using (1) a wet chemical treatment (e.g., DAIKIN's DAAF or DAIF series), (2) a dry stripping treatment, or (3) a dry stripping treatment ($O_2$ or $H_2$) followed by wet chemistry treatment (diluted HF etching). The wet chemical treatment can be done in a wet cleaning module and the dry stripping treatment can be done in a strip module (exemplary embodiments of these modules are described herein and below).

The barrier layer 1002 protects the first conductive layer 1001 from exposure to the solvents and/or oxidizing environment used when cleaning the trench. After the photoresist layer 1037 and the sacrificial material 1004 are removed, the barrier layer 1002 can be "partially removed" in which the exposed portion of the barrier layer 1002 that separates the via 1007 from the first conductive layer 1001 is removed to expose the first conductive layer 1001 to form the structure shown in FIG. 8. The barrier layer 1002 can be removed using conventional method known those skilled in the art such as reactive ion etching (RIE). The barrier layer 1002 removal may be followed by a short wet etch (which employs an etch chemistry that is compatible with the material used to form conductive layer 1001) to clear etch residue from the surface of the conductive layer 1001. When copper is used to make the conductive layers, the exposed portion of barrier layer 1002 should be removed, using a copper compatible chemistry, before any copper electroplating step is applied to fill the via 1007 and the trench 1006.

Figure 9:
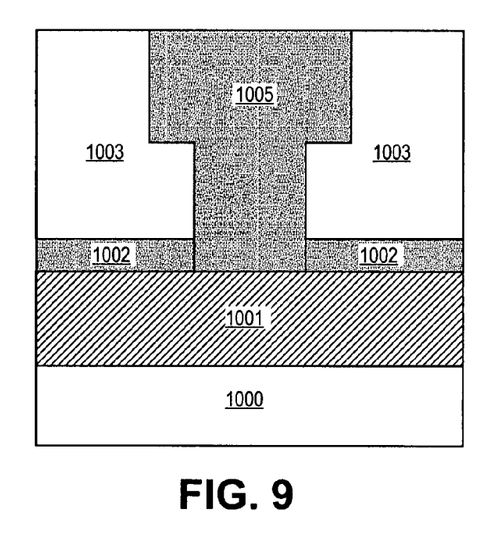

In FIG. 9, following the barrier layer 1002 partially removed, the trench 1006 and the via 1007 are filled with a second conductive layer 1005. The second conductive layer 1005 may comprise any of the materials identified above in connection with the first conductive layer 1001 (e.g., copper or copper formed over a copper/tantalum seed layer). The second conductive layer 1005 may comprise the same conductive material as the first conductive layer 1001, or may comprise a conductive material different from the material used to make the first conductive layer 1001. After the second conductive layer 1005 is formed, a CMP process may be used to planarize the surface of the second conductive layer 1005.

Figure 10:
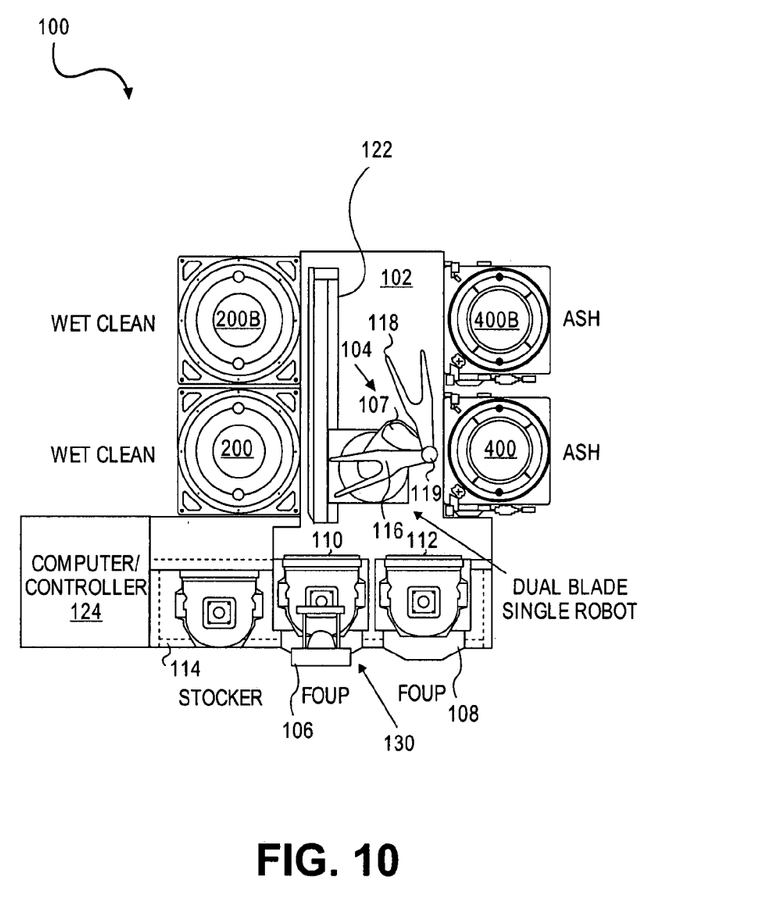
FIG. 10 illustrates an exemplary embodiment of a system that can be used to practice embodiments of the present invention.

FIG. 10 illustrates an apparatus or system 100 that can be used to practice various embodiments of the present invention. It is to be understood that other equipments or systems can be used to practice embodiments of the present invention and that the system 100 is only for illustration purpose and are not to be construed as limitations of the embodiments of the present invention. The system 100 can be used for the stripping (ashing) process or dry stripping process previously mentioned, for instance, to remove (or treat in the process of removal) the photoresist layer 1036, the photoresist layer 1037, or the sacrificial material 1004. The system 100 can also be used for the wet cleaning process as previously mentioned, for instance, to remove or selectively remove the photoresist layer 1036 or the photoresist layer 1037 or the sacrificial material 1004 using an organic acid solvent having ozone dissolved therein when lithographic rework is necessary. The system 100 may be a part of a bigger system used for manufacturing of a semiconductor device or an integrated circuit.

In one embodiment, the system 100 includes a central transfer chamber 102 having a wafer-handling device 104 contained therein. The wafer to be transferred or processed can be the substrate 1001 previously described. Directly attached to the transfer chamber 102 is a single wafer wet cleaning module 200 and a strip (ash) module 400. The wet cleaning module 200 and the strip module 400 are each connected to the transfer chamber 102 through a separately closable opening. In an embodiment of the present invention, a second wet cleaning module 200B and/or a second strip (ash) module 400B are also coupled to the transfer chamber 102. In an embodiment of the present invention, the transfer chamber 102 is maintained at substantially atmospheric pressure (making it an atmospheric transfer chamber) during operation. In one embodiment, the module 200, 200B, 400, and 400B, each can be operated under substantially atmospheric condition thus the transfer chamber 102 can be maintained at such similar condition.

In an embodiment of the present invention, the atmospheric transfer chamber 102 can be opened or exposed to the atmosphere of a semiconductor fabrication "clean room" in which it is located. In such an embodiment, the transfer chamber 102 may contain an overhead filter, such as a hepafilter to provide a high velocity flow of clean air or an inert ambient such as nitrogen ($N_2$), to prevent contaminants from finding their way into the atmospheric transfer chamber. In other embodiments, the atmospheric transfer chamber 102 is a closed system and may contain its own ambient, of clean air or an inert ambient, such as nitrogen gas.

The transfer chamber 102 includes a wafer handler (or wafer handling robot), which can transfer a wafer from one module to another. In an embodiment of the present invention, the wafer handler is a single robot 104 with two wafer handling blades 114 and 116 which both rotate about a single axis 119 coupled to the end of a single arm 120. The robot 104 can be said to be a dual blade single arm, single wrist robot. The robot 104 moves on a track 122 along a single axis in transfer chamber 102.

Also coupled to the transfer chamber 102 is at least one wafer input/output module 130 or pod for providing wafers to the system 100 and for taking wafers away from the system 100. In an embodiment of the present invention, the wafer input/output module 106 is a front opening unified pod (FOUP) which is a container having a slideable and sealable door and which contains a cassette of between 13-25 horizontally spaced wafers. The transfer chamber 102 contains a sealable access door 110, which slides vertically up and down or horizontally across to enable access into and out of the transfer chamber 102. In an embodiment of the present invention, the system 100 includes two FOUP's, 106 and 108 one for providing wafers into the system 100 and one for removing completed or processed wafers from the system 100. However, a wafer can be inputted and outputted from the same FOUP, if desired. A second access door 112 is provided to accommodate a second FOUP 108. Each access door can be attached to the counter part door on each FOUP so that when the transfer chamber access door 110 and 112 slides open, it opens the door of the FOUP to provide access for the robot into the FOUP. The FOUP's can be manually inserted onto the system 100 or a wafer stocking system 114, such as a Stocker, having multiple FOUP's in a rail system can be used to load and remove FOUP's from the system 100.

The system 100 may be configured to include other processing modules such as a chemical vapor deposition module for depositing a film (e.g., a dielectric film or a sacrificial film, an etch module for forming the via or trench, and a photolithographic process tool for patterning the photoresist layer). The system 100 may be configured to include an inspection module or a monitoring module as is known in the art. The system 100 may be configured so that the system 100 includes or can communicate to a sub-atmospheric platform to accommodate the processing modules that operate under a sub-atmospheric condition.

In one embodiment, a system computer 124 is coupled to and controls each of the wet clean module 200 and the strip module 400 (or other additional modules) as well as the operation of the transfer chamber 102 and the robot 104. The system computer 124 controls the operation of the system 100 such as the operation of each of the modules, the transfer chamber 102, the cleaning and drying processes that take place in any one of the modules, and the flow of a wafer (or a plurality of wafers) through the system 100 and/or to control the process within a different module.

In one embodiment, the system computer 124 includes and/or can execute a machine or computer readable instructions that perform various methods of fabricating a semiconductor devices in accordance to embodiments of the present invention. In one embodiment, the instructions perform creating a via in a dielectric layer that is formed on a substrate, filling the via, and optionally, the surface of the dielectric layer with a sacrificial material, forming and patterning a first photoresist layer on the sacrificial material to define a trench for the semiconductor device, and removing the first photoresist layer without affecting the sacrificial material. The instructions may also perform patterning a second photoresist layer on the sacrificial material to define the trench for the semiconductor device, forming the trench, and removing the second photoresist layer and the sacrificial material completely after the trench is formed. The instructions may also perform removing the second photoresist layer and sacrificial material simultaneously or sequentially. The instructions may also perform removing the second photoresist layer using an organic acid having ozone dissolved therein and removing the sacrificial material using a wet chemical treatment, a dry stripping treatment, or a dry stripping treatment with $O_2$ or $H_2$ followed by a wet chemical treatment.

In one embodiment, the system computer 124 includes and/or can execute a machine or computer readable instructions that perform a method of lithographic rework in accordance to embodiments of the present invention. The instructions perform contacting a substrate having formed thereon a sacrificial layer and a first photoresist layer with an acetic acid solution having ozone dissolved therein, the photoresist layer being patterned on the sacrificial layer, and wherein the photoresist layer is contacted with the acetic acid solution having ozone dissolved therein which causes the photoresist layer to be removed without affecting the sacrificial layer.

In one embodiment, the system computer 124 includes and/or can execute a machine or computer readable instructions that perform a method of fabricating a semiconductor device in accordance to embodiments of the present invention. The instructions perform transferring a substrate from an input/output module to a wet cleaning module. The substrate having formed thereon a sacrificial layer and a first photoresist layer patterned on the sacrificial layer. The instructions may also perform contacting an organic acid solvent having ozone dissolved therein to the side of the substrate with the first photoresist layer to remove the first photoresist layer without affecting the sacrificial layer and removing the substrate from the wet cleaning module. The instructions may also perform forming and patterning a second photoresist layer on the sacrificial layer after the first photoresist layer is removed and forming a trench. The substrate may include a dielectric layer and a via formed in the dielectric layer with the via has at least a portion of the sacrificial layer deposited there in and wherein the trench is formed in the dielectric layer. The sacrificial layer and the second photoresist layer are removed after the trench is formed.

Figure 11:
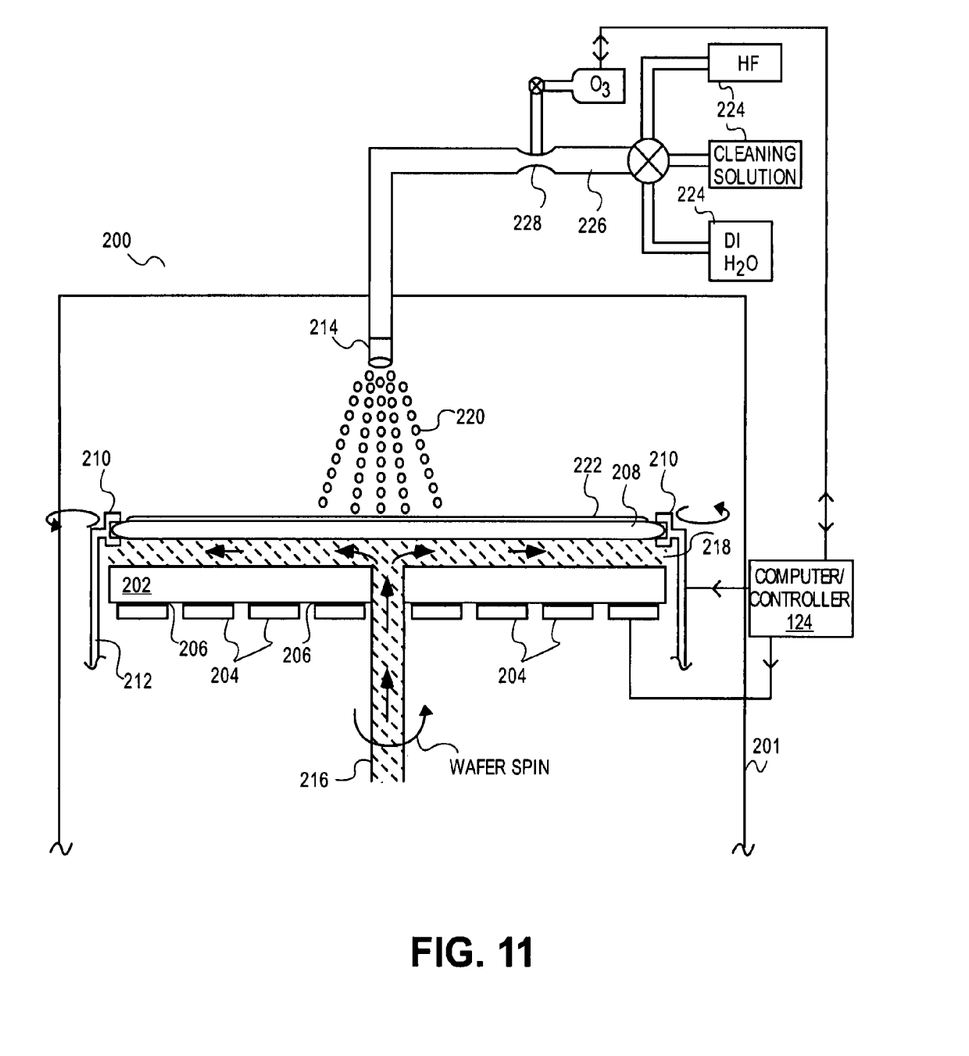
FIGS. 11-13 illustrate an exemplary embodiment of a wet cleaning module that can be part of the system shown in FIG. 10 that can be used to practice embodiments of the present invention.
Figure 12:
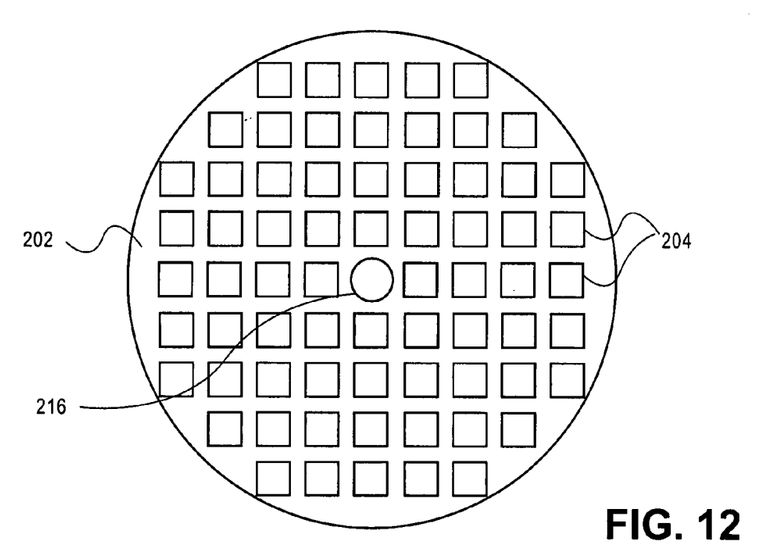
Figure 13:
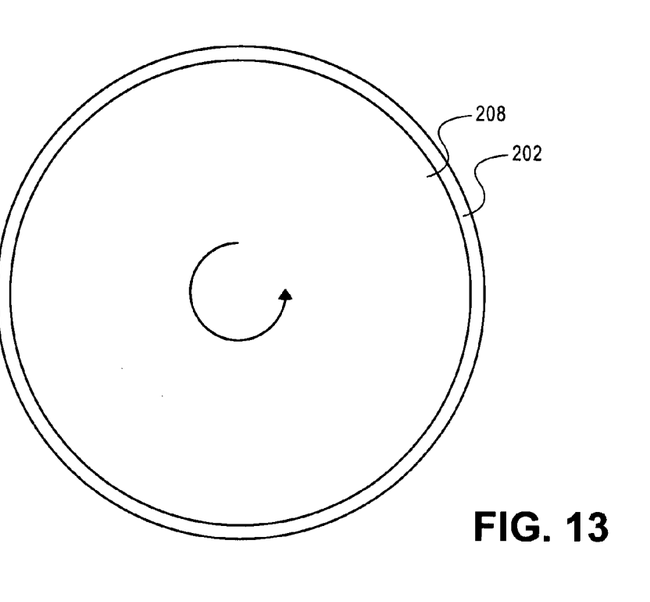

An example of a single wafer cleaning module 200 which can be used as the wet cleaning module 200 and 200B is illustrated in FIGS. 11-13. FIGS. 11-13 illustrate a single wafer cleaning apparatus 200, which utilizes acoustic or sonic waves to enhance a cleaning. The single wafer cleaning apparatus 200 can be used to remove the photoresist layer 1036, in an embodiment, for lithographic rework, using an organic acid solvent having ozone dissolved therein. The single wafer cleaning apparatus 200 can also be used to clean the substrate 1001 throughout the processing whenever wet cleaning is required. The single wafer cleaning apparatus 200 shown in FIG. 11 includes a plate 202 with a plurality of acoustic or sonic transducers 204 located thereon. The plate 202 maybe made of aluminum but can be formed of other materials such as but not limited to stainless steel and sapphire. The plate 202 is maybe coated with a corrosion resistant fluoropolymer such as Halar or PFA. The transducers 204 are attached to the bottom surface of the plate 202 by an epoxy 206. In an embodiment of the present invention, the transducers 204 cover substantially the entire bottom surface of the plate 202 as shown in FIG. 12 and alternatively, cover at least 80% of the plate 202. The transducers 204 generate sonic waves in the frequency range e.g., between 400 kHz and 8 MHz. In an embodiment of the present invention the transducers 204 are piezoelectric devices. The transducers 204 create acoustic or sonic waves in a direction perpendicular to the surface of a wafer 208 that is placed in the single wafer cleaning apparatus 200.

A substrate or wafer 208 is held at distance of about 3 mm above the top surface of the plate 202. The wafer 208 is clamped by a plurality of clamps 210 face up to a wafer support 212 which can rotate the wafer 208 about its central axis. The wafer support 212 can rotate or spin the wafer 208 about its central axis at a rate between 0-6000 rpm. In the apparatus 200, only the wafer support 212 and the wafer 208 are rotated during use whereas the plate 202 remains in a fixed position. Additionally, in the apparatus 200, the wafer 208 is placed face up wherein the side of the wafer with patterns or features such as transistors faces towards a nozzle 214 for spraying cleaning chemicals (e.g., organic acid solvent having ozone dissolved therein or acetic acid solution having ozone dissolved therein) thereon and the backside of the wafer 208 faces the plate 202. Additionally, as shown in FIG. 13, the transducers covered plate 202 has a substantially same shape as the wafer 208 and the plate 202 covers the entire surface area of the wafer 208. The apparatus 200 can include a sealable chamber 201 in which the nozzle 214, the wafer 208, and the plate 202 are located as shown in FIG. 11.

In an embodiment of the present invention, during use, DI water (DI-H2O) is fed through a feed through channel 216 of the plate 202 and fills the gap between the backside of the wafer 208 and the plate 202 to provide a water filled gap 218 through which acoustic waves generated by the transducers 204 can travel to the substrate 208. In an embodiment of the present invention DI water fed between the wafer 208 and the plate 202 is degassed so that cavitation is reduced in the DI water filled gap 218 where the acoustic waves are strongest thereby reducing potential damage to the wafer 208. In an alternative embodiment of the present invention, instead of flowing DI-$H_2O$ through the channel 216 during use, cleaning chemicals, such as the organic acid solvent having ozone dissolved therein can be fed through the channel 216 to fill the gap 218 to provide chemical cleaning of the backside of the wafer 208, if desired.

Additionally during use, cleaning the chemicals and rinsing water such as deionized water (DI-$H_2O$) are fed through a nozzle 214 to generate a spray 220 of droplets, which form a liquid coating 222 on the top surface of the wafer 208 while the wafer 208 is spun. In the present embodiment, the liquid coating 222 can be as thin as 100 micron. In one embodiment, tanks 224 containing cleaning chemicals such as an organic acid solvent, acetic acid solvent, propionic acid solvent, and butyric acid solvent are coupled to the conduit 226 which feeds the nozzle 214. Alternatively, DI-$H_2O$ and HF may also be coupled to the conduit 226 through the tanks 224. In an embodiment of the present invention the diameter of the conduit 226 has a reduced cross-sectional area or a "Venturi" 228 in a line before the nozzle 214 at which point a gas such as $O_3$ (ozone) is dissolved in the solution as it travels to the nozzle 214. The Venturi 228 enables a gas to be dissolved into a fluid flow at gas pressure less than the pressure of the liquid flowing through the conduit 226. The Venturi 228 creates under pressure locally because of the increase in flow rate at the Venturi.

In one embodiment, the single wafer cleaning apparatus 200 is used to selectively remove the photoresist layer 1036 for lithographic rework (or other purposes) so that a new photoresist layer 1036 can be formed and patterned for forming the trench 1003 as previously discussed. In other embodiment, the single wafer cleaning apparatus 200 is used to selectively remove the photoresist layer 1030, also for lithographic rework (or other purposes). Although the following discusses the removal of the photoresist layer 1036, it is to be understood that the embodiments can be used to selectively remove other photoresist layer or like-photoresist layer without affecting the sacrificial material or a layer having similar characteristic as the sacrificial material.

According to an embodiment of the present invention, a cassette or FOUP of wafers having photoresist layers formed thereon that need to be removed are placed in a docking station in the apparatus 100. One or more of the wafers can be the substrate 1001 previously discussed. In one embodiment, the wafer 208 is the substrate 1001 previously described that has the photoresist layer 1036, which needs to be removed for lithographic rework. In one embodiment, the wafer 208 includes a sacrificial material and a photoresist layer as previously described in FIGS. 1-6. The robot 104 removes the wafer 208 from the FOUP 130 and places the wafer into the single wafer cleaning apparatus 200. The single wafer cleaning apparatus 200 is then sealed and the cleaning process begins. In one embodiment, the pressure of the single wafer cleaning apparatus 200 is substantially at atmospheric pressure.

The organic acid solvent (e.g., acetic acid) is then mixed or saturated with the ozone gas and dispensed at the outlet 214 as the droplets 220 of organic acid having ozone dissolved therein to form a thin coating 222 of organic acid having ozone dissolved therein on top of the wafer 208. The wafer 208 is spun (for example at about 1000 rpm) while the organic acid having ozone dissolved therein is being dispensed. In one embodiment, the organic acid having ozone dissolved therein is a 99% acetic acid solution with ozone of about 100 ppm or greater (e.g., 200-400 ppm of ozone). In the present embodiment, the photoresist layer 1036 can be removed at a rate of about 5 µm/min at room temperature. The organic acid solvent having ozone dissolved therein may be dispensed over the wafer 208 for about 20 seconds to several minutes (e.g., 2-3 minutes) to remove the photoresist layer 1036 without affecting the sacrificial material (e.g., DUO, SLAM sacrificial material, or BARC material) 1004. A thicker photoresist layer 1036 would require a little more time for the cleaning.

In another embodiment, a small amount of HF is added to the organic acid solvent having ozone dissolved therein to remove contaminants that may have formed during the photoresist cleaning process. In one embodiment, about 2% of HF is included in the organic acid solvent having ozone dissolved therein.

In one embodiment, dispensing of the organic acid having ozone dissolved therein, mixing of the acetic acid and the ozone, dispensing of the organic acid having ozone dissolved therein, spinning of the wafer 208 as well as other operations associated with the apparatus 200 is controlled by the system computer 124. For instance, the system computer 124 is capable of controlling operations such as loading a wafer to be processed into the transfer chamber and into individual modules, transferring the wafer from one module to another module, opening and closing the particular module, setting the parameters of the modules, etc . . . so that the embodiments described herein can be carried out in the system 100.

Figure 14:
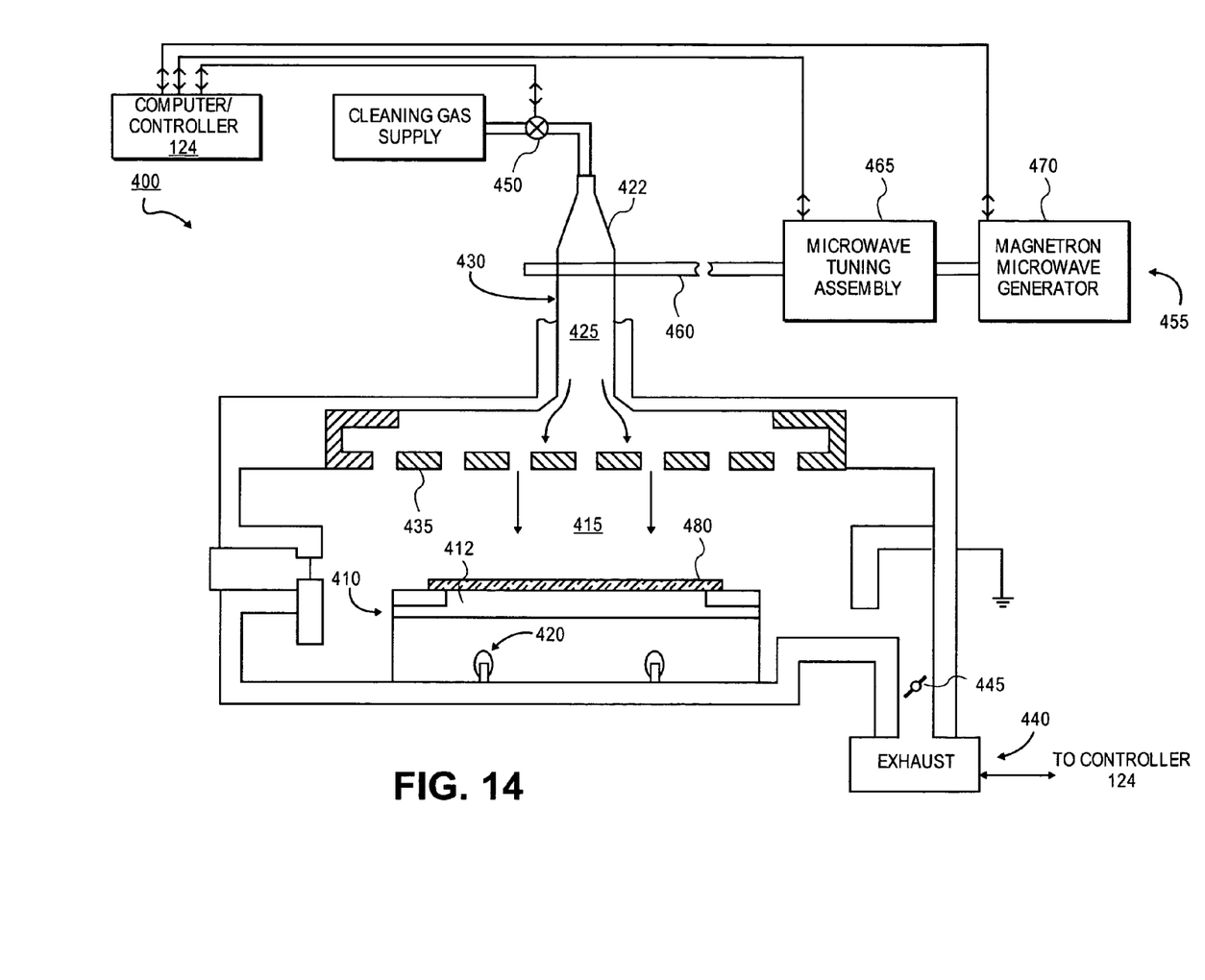
FIG. 14 illustrates an exemplary embodiment of a dry stripping module that can be part of the system shown in FIG. 10 that can be used to practice embodiments of the present invention.

FIG. 14 illustrates a strip or dry cleaning module 400 of the system 100 in accordance with an embodiment of the present invention. In the cleaning chamber 400 of the type illustrated in FIG. 14, an energized process gas comprising cleaning gas is provided to clean a substrate 480 held on a support 410 in a process zone 415. The support 410 supports the substrate 480 in the process zone 415 and may optionally comprise an electrostatic chuck 412. Within or below the support 410, a heat source, such as infrared lamps 420, can be used to heat the substrate 480. The process gas comprising cleaning gas may be introduced through a gas distributor 422 into a remote plasma generation zone 425 in a remote chamber 430. By "remote" it is meant that the center of the remote chamber 430 is at a fixed upstream distance from the center of a process zone 415 in the cleaning chamber 400. In the remote chamber 430, the cleaning gas is activated by coupling microwave or RF energy into the remote chamber 430, to energize the cleaning gas and cause ionization or dissociation of the cleaning gas components, prior to its introduction through a diffuser 435, such as a showerhead diffuser, into the process zone 415. Alternatively, the process gas may be energized in the process zone 415. Spent cleaning gas and residue may be exhausted from the cleaning chamber 400 through an exhaust system 440 capable of achieving a low pressure in the cleaning chamber 400. A throttle valve 425 in the exhaust 440 is used for maintaining a chamber pressure from about 150 mTorr to about 3000 mTorr.

In one embodiment, the remote chamber 430 comprises a tube shaped cavity containing at least a portion of the remote plasma zone 425. Flow of the cleaning gas into the remote chamber 430 is adjusted by a mass flow controller or gas valve 450. The remote chamber 430 may comprise wall made of a dielectric material such as quartz, aluminum oxide, or monocrystalline sapphire that is substantially transparent to microwave and is non-reactive to the cleaning gas. A microwave generator 455 is used to couple microwave radiation to the remote plasma zone 425 of the remote chamber 430. A suitable microwave generation 455 is an "ASTEX" Microwave Plasma Generator commercially available from Applied Science & Technology, Inc., Woburn, Mass. Microwave generator assembly 455 may comprise a microwave applicator 460, a microwave tuning assembly 465, and a magnetron microwave generator 470. The microwave generator may be operated at a power level of about 200 to about 3000 Watts, and at a frequency of about 800 MHz to about 3000 MHz. In one embodiment, the remote plasma zone 425 is sufficiently distant from the process zone 415 to allow recombination of some of the dissociated or ionized gaseous chemical species. The resultant reduced concentration of free electrons and charged species in the activated cleaning gas minimizes charge-up damage to the active devices on the substrate 480, and provides better control of the chemical reactivity of the activated gas formed in the remote plasma zone 425. In another embodiment, the center of the remote plasma zone 425 is maintained at a distance of at least about 50 cm from the center of the process zone 415.

A cleaning process may be performed in the cleaning chamber 400 by exposing the substrate 480 to energized process gas comprising cleaning gas to, for example, remove remnant resist and/or to remove or inactivate etchant residue remaining on the substrate after the substrate is etched (e.g., after the via 1007 and the trench 1006 are etched). Remnant resist (e.g., the photoresist layer 1030 and the photoresist layer 1036 may be removed from the substrate 480 in a stripping (or ashing) process by exposing the substrate 480 to energized process gas comprising stripping gas. Stripping gas may comprise, for example, one or more of $O_2$, $N_2$, $H_2$, $H_2O$, $NH_3$, $CF_4$, $C_2F_6$, $CHF_3$, $C_3H_2F_6$, $C_2H_4F_2$, $CH_3$ and HF. Cleaning using the stripping gas may be referred to as stripping process or dry stripping process.

In one embodiment, a cleaning process is performed in the cleaning chamber 400 by exposing a wafer 480 to energized process gas comprising cleaning gas. In one embodiment, the wafer 480 is the substrate 1001 previously described and the wafer 480 is placed in the chamber 400 for removing the photoresist layer 1030 or 1037 remaining on the substrate 1001 after the trench and via on the substrate 1001 are etched. The wafer 480 can be placed in the chamber 400 using the robot 104 similar to previously discussed. Remnant resist may be removed from the wafer 480 in a stripping (or ashing) process by exposing the substrate 480 to energized process gas comprising stripping gas.

The stripping gas may comprise, for example, one or more of $O_2$, $N_2$, $H_2$, $H_2O$, $NH_3$, $CF_4$, $C_2F_6$, $CHF_3$, $C_3H_2F_6$, $C_2H_4F_2$, $CH_3F$ and HF. In stripping gas for stripping polymeric resist material comprises (i) oxygen, and optionally (ii) an oxygen activating gas or vapor, such as water vapor, nitrogen gas, or fluorocarbon gas, the fluorocarbon gases including any of those listed above. The oxygen activating gas increases the concentration of oxygen radicals in the stripping gas. The stripping gas composition may comprise oxygen and nitrogen in a volumetric flow ratio of about 6:1 to about 200:1, and more likely from about 10:1 to about 12:1. For a 5-liter process chamber 400, a suitable gas flow rate comprises 3000 to 3500 sccm of $O_2$ and 300 sccm of $N_2$. In one version, a stripping gas comprises about 35000 sccm $O_2$, about 200 sccm $N_2$ and optionally about 300 sccm $H_2O$ that is energized at a power level of about 1400 watts and introduced into the cleaning chamber 108 at a pressure of about 2 Torr for about 15 seconds. In one version, the water vapor content in the stripping gas should be less than about 20% by volume of the combined oxygen and nitrogen gas content to provide adequate stripping rates. A suitable ratio of the volumetric water vapor flow $VH_2O$ to the combined volumetric flow of oxygen and nitrogen ($VO_2+VN_2$) is from about 1:4 to about 1:40, and more likely about 1:10. When the remnant resist comprises oxide hard mask, suitable stripping gases are gases capable of stripping oxide, such as halogen containing gases, including $CF_4$, $C_2F_6$, $CHF_3$, $C_3H_2F_6$, $C_2H_4F_2$, and HF. The substrate 500 may be exposed to the stripping gas for a period of time of from about 10 seconds to about 1000 seconds, and more likely for about 45 seconds.

In one embodiment, the substrate 480 may be heated during the stripping processes. For example, when cleaning the substrate 480 in the cleaning chamber 400, the lamps 420 may be used to heat the substrate 480 to a temperature of at least about 150° C., and more specifically to a temperature of at least about 250° C. Heating the substrate 480 may improve the removal rate of the photoresist and may also improve the removal rate of some etchant residue.

In one embodiment, the chamber 400 is used to remove the photoresist layer 1037 and/or the sacrificial material 1004 after the trench 1060 is formed. In one embodiment, the photoresist layer 1037 is removed using an ashing process. The photoresist layer 1037 can be removed with suitable stripping gases capable of stripping oxide, such as halogen containing gases, including $CF_4$, $C_2F_6$, $CHF_3$, $C_3H_2F_6$, $C_2H_4F_2$, and HF. In the present embodiment, the stripping gas is fed into the chamber 400 in an energized state as previously described. The temperature for the stripping process may be high for example, may be at least about 150° C. or alternatively, at least about 250° C. In the present embodiment, the stripping gas may be selected so that both the photoresist layer 1037 and the sacrificial material 1004 are removed simultaneously. Residual sacrificial material 1004 that is not removed by the dry stripping process can be removed using a wet etching process, for instance, by treating the residual sacrificial material 1004 with a fluoride-based chemistry or an alkaline-based chemistry in the wet cleaning module 200.

In another embodiment, the module 200 is used for the removal of the photoresist layer 1037. In the present embodiment, the photoresist layer 1037 is removed using the organic acid solvent having ozone dissolved therein (e.g., acetic acid with ozone dissolved therein) similar to how the photoresist layer 1030 or 1036 is removed as previously described. In one embodiment, the substrate 1000 is placed in the wet cleaning module 200 so that the photoresist layer 1037 can be treated with the organic acid solvent comprising ozone using methods previously discussed. After the photoresist layer 1037 is removed, the sacrificial material 1004 is removed using a suitable process. In one embodiment, after the photoresist layer 1037 is removed, the substrate 1000 is transferred from the wet cleaning module 200 into the wet cleaning module 200B so that the sacrificial material 1004 can be treated with suitable removal chemistry such as DAIKIN's DAAF or DAIF solution. Other solutions mentioned above can be used instead. Alternatively, the substrate 1000 can be retained in the wet cleaning module 200 after the photoresist layer 1037 is removed and the chemistry source to be fed into the cleaning module 200 is changed so that the solution needed for the removal of the sacrificial material 1004 can be dispensed over the substrate 1000.

In another embodiment, after the photoresist layer 1037 is removed as previously described, the sacrificial material 1004 can be removed by a dry stripping process in the dry strip module 400 using methods previously described. In yet another embodiment, after the photoresist layer 1037 is removed as previously described, the sacrificial material 1004 can be removed by a dry stripping process in the dry strip module 400 using methods previously described followed by a wet cleaning process in the wet cleaning module 200 using an etchant solution such as HF, also using methods previously described.

Although the foregoing description has specified certain steps, materials, and equipments that may be used in such a method to make such an integrated circuit, those skilled in the art will appreciate that many modifications and substitutions may be made. For example, although the embodiments have been described in the context of making a dual damascene device, the invention is not limited to that particular application. Accordingly, it is intended that all such modifications, alterations, substitutions and additions be considered to fall within the spirit and scope of the invention as defined by the appended claims.

I claim:

1. A method of fabricating a semiconductor device comprising:
    creating a via in a dielectric layer formed on a substrate;
    filling the via, and optionally, the surface of the dielectric layer with a sacrificial material;
    forming and patterning a first photoresist layer on the sacrificial material to define a trench for the semiconductor device; and
    removing the first photoresist layer completely without removing the sacrificial material,
    wherein the first photoresist layer is removed using an organic acid solvent having ozone dissolved therein.

2. The method of claim 1 further comprising:
    forming and patterning a second photoresist layer on the sacrificial material to define the trench for the semiconductor device;
    forming the trench; and
    removing the second photoresist layer and the sacrificial material completely.

3. The method of claim 2 further comprising:
    filling the trench and the via with a first conductive material.

4. The method of claim 3 wherein the second photoresist layer is removed with an organic acid solvent having ozone dissolved therein and the sacrificial layer is removed with a stripping process in a dry strip module.

5. The method of claim 3 wherein the second photoresist layer is removed with an organic acid solvent having ozone dissolved therein and the sacrificial layer is removed with a stripping process in a dry strip module followed by an etching chemistry treatment.

6. The method of claim 5 wherein the second photoresist layer is removed with an acetic acid solution having ozone dissolved therein and the sacrificial layer is removed with a stripping process in a dry strip module followed by a diluted hydrogen fluoride treatment.

7. The method of claim 3 wherein the second photoresist is removed using a stripping process by exposing the substrate to an energized process gas comprising one or more of $O_2$, $N_2$, $H_2$, $H_2O$, $NH_3$, $CF_4$, $C_2F_6$, $CHF_3$, $C_3H_2F_6$, $C_2H_4F_2$, $CH_3F$, and HF.

8. The method of claim 3 further comprising:
    forming a second conductive layer on top of the substrate and below the dielectric layer.

9. The method of claim 8 further comprising:
    forming an etch stop layer on top of the second conductive layer and below the dielectric layer and removing the etch stop layer after the second photoresist layer and the sacrificial material are removed.

10. The method of claim 1 wherein the first photoresist layer is removed at a rate of about 5 pm/minute at room temperature.

11. The method of claim 1 wherein a hydrogen fluoride solution is added to the organic acid solvent comprising ozone.

12. The method of claim 1 wherein the first photoresist layer is removed using a treatment solution having about 99% acetic acid and ozone of about 100 ppm or higher concentration.

13. The method of claim 1 wherein removing the first photoresist further comprises one of contacting the substrate with an acetic acid solution having ozone dissolved therein, contacting the substrate with a propionic acid solution having ozone dissolved therein, and contacting the substrate with a butyric acid solution having ozone dissolved therein.

14. A method of fabricating a semiconductor device comprising:
    creating a via in a dielectric layer formed on a substrate;
    filling the via, and optionally, the surface of the dielectric layer with a sacrificial material;
    forming and patterning a first photoresist layer on the sacrificial material to define a trench for the semiconductor device;
    removing the first photoresist layer completely without removing the sacrificial material;
    forming and patterning a second photoresist layer on the sacrificial material to define the trench for the semiconductor device;
    forming the trench;
    removing the second photoresist layer and the sacrificial material completely; and
    filling the trench and the via with a first conductive material;
    wherein the second photoresist layer is removed using an organic acid solvent having ozone dissolved therein and wherein the sacrificial layer is removed using any one of a fluoride-based chemistry, a non-aqueous alkaline-based chemistry, an aqueous alkaline-based chemistry, and a partially aqueous alkaline-based chemistry.

15. A method for lithographic rework comprising:
contacting a substrate having formed thereon a sacrificial layer and a first photoresist layer with an acetic acid solution having ozone dissolved therein, the first photoresist layer being patterned on the sacrificial layer; and
wherein the contacting includes contacting the first photoresist layer with the acetic acid solution having ozone dissolved therein and wherein the contacting removes the first photoresist layer without affecting the sacrificial layer.

16. The method of claim 15 wherein the contacting includes placing the substrate in a wet cleaning module and dispensing the acetic acid solution having ozone dissolved therein over the substrate over the side of the substrate with the first photoresist layer.

17. The method of claim 16 wherein the substrate is spun while the acetic acid solution having ozone dissolved therein is being dispensed over the substrate.

18. The method of claim 17 wherein dispensing the acetic acid solution having ozone dissolved therein over the substrate includes forming a liquid coating on the side of the substrate with the first photoresist layer.

19. The method of claim 15 further comprising:
forming and patterning a second photoresist layer over the sacrificial layer after the first photoresist layer is removed.

20. The method of claim 19 wherein the substrate further includes a dielectric layer having a via created therein and wherein at least a portion of the sacrificial layer fills the via.

21. The method of claim 20 further comprising:
creating a trench in the dielectric layer, wherein a region for the trench is defined by the second photoresist layer.

22. A method for fabricating a semiconductor device comprising:
transferring a substrate from an input/output module to a wet cleaning module, the substrate having formed thereon a sacrificial layer and a first photoresist layer patterned on the sacrificial layer;
contacting an organic acid solvent having ozone dissolved therein to the side of the substrate with the first photoresist layer to remove the first photoresist layer without affecting the sacrificial layer; and
removing the substrate from the wet cleaning module.

23. The method of claim 22 further comprising:
forming and patterning a second photoresist layer on the sacrificial layer after the first photoresist layer is removed.

24. The method of claim 23 further comprising:
forming a trench wherein the substrate further includes a dielectric layer and a via formed in the dielectric layer, the via has at least a portion of the sacrificial layer deposited therein, wherein the trench is formed in the dielectric layer, and wherein a region for the trench is defined by the second photoresist layer.

25. The method of claim 24 further comprising:
removing the second photoresist layer after the trench is formed.

26. The method of claim 25 further comprising:
removing the sacrificial layer.

27. The method of claim 26 further comprising:
filling the trench and the via with a conductive material after the second photoresist layer and the sacrificial material are removed.

28. The method of claim 25 wherein the sacrificial layer is further removed by contacting a fluoride containing solution to the sacrificial layer.

29. The method of claim 25 wherein the sacrificial layer is further removed by subjecting the sacrificial layer to a dry stripping process.

30. The method of claim 25 wherein the sacrificial layer is further removed by a method comprising:
subjecting the sacrificial layer to a dry stripping process; and
contacting the sacrificial layer to an etching solution.

31. The method of claim 30 wherein the etching solution include hydrogen fluoride.

32. The method of claim 24 further comprising:
removing the second photoresist layer and the sacrificial material substantially simultaneously after the trench is formed.

33. The method of claim 24 further comprising:
removing the second photoresist layer using an organic acid solvent having ozone dissolved therein after the trench is formed.

34. The method of claim 24 further comprising:
removing the second photoresist layer using a stripping process gas comprising exposing the substrate to an energized gas comprising one or more of $O_2$, $N_2$, $H_2$, $H_2O$, $NH_3$, $CF_4$, $C_2F_6$, $CHF_3$, $C_3H_2F_6$, $C_2H_4F_2$, $CH_3F$, or HF.

35. The method of claim 24 further comprising:
removing the sacrificial layer after the trench is formed using any one of a fluoride based chemistry, a non-aqueous alkaline-based chemistry, an aqueous alkaline-based chemistry, and a partially aqueous alkaline-based chemistry.

36. The method of claim 22 wherein the organic acid solvent having ozone dissolved therein is one of acetic acid having ozone dissolved therein, propionic acid having ozone dissolved therein, and butyric acid having ozone dissolved therein.

37. The method of claim 22 wherein the first photoresist layer is removed at a rate of about 5 μm/min at room temperature.

38. The method of claim 22 further comprising:
adding hydrogen fluoride to the organic acid solvent having ozone dissolved therein.

39. The method of claim 22 wherein the sacrificial layer is further removed by any one of the following methods:
contacting a fluoride containing solution to the sacrificial layer;
subjecting the sacrificial layer to a dry stripping process; and
subjecting the sacrificial layer to a dry stripping process followed by contacting the sacrificial layer to an etching solution.

40. The method of claim 22 wherein the sacrificial material includes anyone of a sacrificial light material, a DUO material, and a BARC material.

41. The method of claim 22 wherein wet cleaning module includes a plate having a plurality of transducers coupled thereto, a nozzle to dispense the organic acid solvent having ozone dissolved therein and a support member to support the substrate.

42. The method of claim 41 wherein contacting the ozone saturated organic acid solvent to the side of the substrate with the first photoresist layer to remove the first photoresist layer without affecting the sacrificial layer further includes:
dispensing the organic acid solvent having ozone dissolved therein over the side of the substrate with the first photoresist layer while creating one of sonic waves or acoustic waves, wherein the transducers create the sonic waves or the acoustic waves.

* * * * *